United States Patent
Pazhayaveetil et al.

(10) Patent No.: US 9,912,238 B1
(45) Date of Patent: Mar. 6, 2018

(54) DETERMINATION OF INDUCTOR CURRENT DURING REVERSE CURRENT IN A BOOST CONVERTER

(71) Applicant: Cirrus Logic, Inc., Austin, TX (US)

(72) Inventors: Ullas Pazhayaveetil, Cedar Park, TX (US); Jeffrey May, Dripping Springs, TX (US); Gautham D. Kamath, Austin, TX (US); John Christopher Tucker, Austin, TX (US); Christian Larsen, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 347 days.

(21) Appl. No.: 14/182,939

(22) Filed: Feb. 18, 2014

Related U.S. Application Data

(60) Provisional application No. 61/858,939, filed on Jul. 26, 2013.

(51) Int. Cl.
    *G05F 1/00*     (2006.01)
    *H02M 3/158*    (2006.01)
    *H02M 3/156*    (2006.01)

(52) U.S. Cl.
    CPC ........... *H02M 3/158* (2013.01); *H02M 3/156* (2013.01)

(58) Field of Classification Search
    CPC ..... H02M 3/156; H02M 3/1588; G05F 1/613; G05F 3/24
    USPC ............... 323/222, 223, 265, 271, 282, 283, 323/284–285
    See application file for complete search history.

(56) References Cited

U.S. PATENT DOCUMENTS

| | | | |
|---|---|---|---|
| 7,265,530 B1 | 9/2007 | Broach et al. | |
| 7,425,819 B2 | 9/2008 | Isobe | |
| 7,737,668 B2 | 6/2010 | Oswald et al. | |
| 7,898,825 B2 | 3/2011 | Mulligan et al. | |
| 2005/0168198 A1* | 8/2005 | Maksimovic | H02M 1/4225 323/222 |
| 2011/0109283 A1* | 5/2011 | Kapels | H02M 3/1588 323/235 |
| 2012/0182001 A1* | 7/2012 | Huang | H02M 3/158 323/283 |
| 2012/0306466 A1* | 12/2012 | Tabuchi | H02M 3/156 323/282 |
| 2013/0069613 A1* | 3/2013 | Nakase | H02M 3/156 323/284 |

(Continued)

OTHER PUBLICATIONS

International Search Report and Written Opinion dated Nov. 21, 2014, during examination of PCT/US2014/047624.

*Primary Examiner* — Nguyen Tran
(74) *Attorney, Agent, or Firm* — Norton Rose Fulbright US LLP

(57) ABSTRACT

During operation of a boost converter conditions may exist that result in a reverse current through the boost converter, such as when a load drop from the boost converter occurs. During the reverse current period, inductance value determinations made during a forward current period may be used to estimate a magnitude of the reverse current and this estimate used by a controller to control the boost converter and return the boost converter to normal operation. The controller may control the boost converter by changing a ratio of charging and discharging time for an inductor of the boost converter, decreasing a bandwidth of the boost converter, and/or increasing a resistance of the boost converter.

16 Claims, 7 Drawing Sheets

(56) References Cited

U.S. PATENT DOCUMENTS

2013/0257533 A1* 10/2013 Krabbenborg ............ G05F 5/00
330/251

* cited by examiner

US 9,912,238 B1

DETERMINATION OF INDUCTOR CURRENT DURING REVERSE CURRENT IN A BOOST CONVERTER

FIELD OF THE DISCLOSURE

This application claims benefit of priority to U.S. Provisional Patent No. 61/858,939 to Ullas Pazhayaveetil et al. filed on Jul. 26, 2013 and entitled "Methods and Apparatuses for Digitally Regulated Peak Current Mode Controlled Boost Converter with Dynamic Level Adjustment," which is hereby incorporated by reference.

FIELD OF THE DISCLOSURE

The instant disclosure relates to an audio amplifier. In particular, the instant disclosure relates to power converters for audio amplifiers.

BACKGROUND

Portable devices are becoming more common in every aspect of our lives and affect how we interact with our music. For example, many consumers listen to their music from portable audio players, such as MP3 players or their cellular phones. These portable devices become easier and more enjoyable to use when the portable devices shrink in size while offering the same capabilities and when the portable devices can last longer from a single battery charge. To support longer lasting devices, the operating voltage of the components inside the portable device is often reduced to reduce power consumption by these components. However, a reduction in operating voltage affects the sound output of the portable device because the volume level of an audio signal output to a speaker is proportional to the output voltage. Thus, boost converters have been used to increase operating voltages for select components within a portable device that benefit from higher voltages, such as the audio amplifier that needs high voltages to generate high volumes.

FIG. 1 is a conventional audio amplifier with a boost converter. An audio amplifier 100 for a mobile device includes a battery supply 102 that provides a voltage, $V_p$, to a boost converter 104. The boost converter 104 increases the voltage $V_p$ to a boost voltage, $V_{bst}$. A speaker amplifier 108 receives the boost voltage, $V_{bst}$, and an analog audio signal, sig, from a digital-to-analog converter (DAC) 106. The speaker amplifier 108 increases the low power signal of the audio signal, sig, with power received from the boost converter 104 to generate a signal to drive a speaker 110. The boost voltage, $V_{bst}$, is higher than the supply voltage, $V_p$, which allows the speaker amplifier 108 to provide louder volume ranges through the speaker 110 than possible with only the supply voltage, $V_p$.

However, providing the boost voltage, $V_{bst}$, to the speaker amplifier 108 has drawbacks, such as increased power consumption. That is, because the speaker amplifier 108 is receiving the boost voltage, $V_{bst}$, even if volume levels are low, then the speaker amplifier 108 is wasting power. This wasted power shortens the operating time of a portable device between charges and hurts the user's experience with the portable device. Additional inefficiencies exist, such as undesirable power consumption and transients that occur when the speaker 110 is connected and disconnected from the speaker amplifier 108 while the amplifier 108 is receiving the boosted voltage, $V_{bst}$. Further, the increased power consumption by the speaker amplifier 108 may cause thermal management problems. Particularly as portable devices shrink in size and have less space for heat dissipation, the speaker amplifier 108 may be constrained in volume ranges it can provide by heat buildup in the speaker amplifier 108 or the boost converter 104. Each of these shortcomings is due to the static nature of the boost voltage, $V_{bst}$, provided to the speaker amplifier 108.

Shortcomings mentioned here are only representative and are included simply to highlight that a need exists for improved audio amplifiers, particularly for consumer-level devices. Embodiments described here address certain shortcomings but not necessarily each and every one described here or known in the art.

SUMMARY

A controller of a boost converter may be configured to dynamically adjust conditions within the boost converter by monitoring conditions in the boost converter. For example, the controller may determine an current inductance value for an inductor of the boost converter by monitoring a current through the inductor. When the inductor value of the inductor is known, a slope compensation value may be used in determining a transition time between charging the inductor of the boost converter and discharging the inductor.

The determined inductance value for the inductor of the boost converter may be used by a controller in controlling the boost converter during reverse current conditions, such as after a load drop from the boost converter. The determined inductance may be used to estimate the magnitude of reverse current through the inductor and control charging and discharging of the inductor to return the boost converter to normal operation.

In one embodiment, a method may include measuring a current through an inductor of a boost converter; determining, in a digital controller, an inductance value of the inductor based, at least in part, on the measured current; and/or determining a slope compensation for the inductor based, at least in part, on the determined inductance value.

In some embodiments, the method may also include determining an approximate time the current through the inductor will reach a peak current level; toggling between charging the inductor and discharging the inductor before the approximate time; determining, in the digital controller, a second inductance value of the inductor at a different time than the determined first inductance value based, at least in part, on a second measured current through the inductor; updating the determined slope compensation based, at least in part, on the second determined inductance value; and/or calibrating the determined inductance value to an initial inductance value.

In certain embodiments, the step of determining may include calculating a propagation delay in toggling between charging the inductor and discharging the inductor; and/or the step of determining the slope compensation comprises determining a slope compensation from the equation: $0.5 * K_{CM} * (V_{bst} - V_P)/L_{boost}$, wherein $K_{CM}$ is a gain value, $V_{bst}$ is the boost voltage, $V_P$ is a supply voltage, and $L_{boost}$ is the inductance value of the inductor.

In another embodiment, an apparatus may include a boost converter comprising an inductor and configured to generate a boost voltage from a supply voltage; and/or a controller coupled to the boost converter and configured to measure an inductance value of the inductor, and to determine a slope compensation for the inductor based, at least in part, on the determined inductance.

In some embodiments, the boost converter may include a boost voltage output node coupled to the inductor; a p-channel field effect transistor (PFET) coupled to the inductor and configured to couple the inductor to the boost voltage output node; and an n-channel field effect transistor (NFET) coupled to the inductor and configured to couple the inductor to a ground, wherein the controller is configured to calculate a propagation delay in toggling the PFET and the NFET.

In some embodiments, the apparatus may also include a current measurement circuit coupled to the inductor; a digital-to-analog converter (DAC) coupled to the current measurement circuit and coupled to the controller, wherein the controller may be configured to determine the inductance value by reading the digital-to-analog converter (DAC); and/or an n-channel field effect transistor (NFET) coupled to the inductor and configured to couple the inductor to a ground, wherein the current measurement circuit includes a current mirror coupled to the n-channel field effect transistor (NFET).

In certain embodiments, the controller may be further configured to determine an approximate time a current through the inductor will reach a peak current level; the controller may be configured to toggle the NFET and the PFET before the approximate time; the controller may be configured to determine the slope compensation based on the equation $0.5*K_{CM}*(V_{bst}-V_P)/L_{boost}$, wherein $K_{CM}$ is a gain value, $V_{bst}$ is the boost voltage, $V_P$ is a supply voltage, and $L_{boost}$ is the inductance value of the inductor; the controller may be configured to determine a second inductance value of the inductor at a different time than the determined first inductance value based, at least in part, on a second measured current through the inductor; and/or the controller may be configured to update the determined slope compensation based, at least in part, on the second determined inductance value.

In yet another embodiment, an integrated circuit may include an audio input node configured to receive an audio signal; a supply input node configured to receive a supply voltage; a boost converter coupled to the supply input node, comprising an inductor, and configured to output a boost voltage higher than the supply voltage; and/or a boost converter controller coupled to the boost converter. The boost converter may be configured to measure a current through the inductor; to determine an inductance value of the inductor based, at least in part, on the measured current; and/or to determine a slope compensation for the inductor based, at least in part on the determined inductance value.

In some embodiments, the integrated circuit may also include a boost voltage output node coupled to the inductor and configured to output the boost voltage; an n-channel field effect transistor (NFET) coupled to the inductor and configured to couple the inductor to a ground; and a p-channel field effect transistor (PFET) coupled to the inductor and configured to couple the inductor to the boost voltage output node, wherein the controller may be configured to determine an approximate time the current through the inductor will reach a peak current level and configured to toggle the NFET and the PFET before the approximate time.

In certain embodiments, the controller may be configured to measure a second inductance value of the inductor at a second time; the controller may be configured to determine a slope compensation for the inductor based, at least in part, on the determined second inductance value; and/or the controller may be configured to determine the slope compensation based on the equation $0.5*K_{CM}*(V_{bst}-V_P)/L_{boost}$, wherein $K_{CM}$ is a gain value, $V_{bst}$ is the boost voltage, $V_P$ is a supply voltage, and $L_{boost}$ is the inductance value of the inductor.

In one embodiment, a method may include measuring a first current through an inductor of a boost converter during a first time period of a switch cycle, before current through the inductor crosses through zero current; determining a second current through the inductor based, at least in part, on the first current during a second time period of the switch cycle after the first time period; and controlling discharging and charging of the inductor of the boost converter during the second time period based, at least in part, on the determined second current to recover the boost converter from the reverse current operation.

In some embodiments, the step of measuring the first current may include mirroring the first current through the inductor in a field effect transistor (FET); the step of determining the second current may include estimating an inductance value of the inductor based, at least in part, on the measured first current; the step of determining the second current may include calculating the second current based, at least in part, on the estimated inductance value; the step of calculating may include calculating the second current based, at least in part, on the estimated inductance value, a boost voltage value, and a supply voltage value; the step of controlling the recovery may include controlling a duration of a first time period for building current in the inductor; and/or the step of controlling the recovery may include controlling a duration of a second time period for discharging the inductor into a capacitor of the boost converter.

In certain embodiments, the method may also include detecting a load drop before the step of controlling recovery; decreasing a bandwidth of the boost converter to limit the second current after detecting the load drop; and/or increasing a resistance of a transistor coupled to the inductor to limit the second current after detecting the load drop.

In another embodiment, an apparatus may include a boost converter and a controller coupled to the boost converter. The boost converter may include a boost voltage output node configured to output a boost voltage to an audio amplifier driving a load; an inductor coupled to the boost voltage output node; and/or a current measurement circuit coupled to the inductor. The controller may be configured to measure a first current through an inductor of a boost converter during a first time period of a switch cycle, before current through the inductor crosses through zero current; determine a second current through the inductor based, at least in part, on the first current during a second time period of the switch cycle after the first time period; and/or control charging and discharging of the inductor of the boost converter during the second time period based, at least in part, on the second current to recover the boost converter from the reverse current operation.

In some embodiments, the boost converter may include a first n-channel field emission transistor (NFET) coupled to the inductor and configured to couple the NFET to a ground; the current monitoring circuit may include a second n-channel field emission transistor (NFET) coupled to the NFET of the boost converter and configured to mirror a current in the first NFET; the boost converter may include an analog-to-digital converter (ADC) coupled to the current monitoring circuit; the controller may be configured to measure the first current by reading the analog-to-digital converter (ADC); the controller may be configured to estimate an inductance value of the inductor based, at least in part, on the measured first current; the controller may be configured to calculate the second current based, at least in part, on the estimated inductance value; the controller may be configured to calculate the second current based, at least in part, on the estimated inductance value, the boost voltage, and a supply voltage; the controller may be configured to detect a drop in the load before controlling the recovery; the controller may be configured to decrease a bandwidth of the boost converter after detecting the drop in the load; the controller may be configured to increase a resistance of a transistor coupled to the inductor after detecting the drop in the load; the boost converter may include a capacitor coupled to the boost voltage output node; the controller may be configured to control a duration of a first time period for building current in the inductor; the controller may be configured to control a duration of a second time period for discharging the inductor into the capacitor of the boost converter; and/or the controller and the boost converter may be integrated in an integrated circuit.

In a further embodiment, an integrated circuit may include an audio output node configured to drive a load with an amplified audio signal; an audio amplifier configured to amplify an audio signal to generate the amplified audio signal at the audio output node; a boost converter coupled to the audio amplifier; and/or a boost converter controller coupled to the boost converter. The boost converter may include an inductor; a first switch coupled to the inductor and configured to couple the inductor to the audio output node; a second switch coupled to the inductor and configured to couple the inductor to a ground; a current monitoring circuit configured to measure a current through the inductor; and/or an analog-to-digital converter (ADC) coupled to the current monitoring circuit. The boost converter controller may be configured to measure a first current through the inductor of the boost converter during a first time period when current is flowing through the inductor; determine a second current through the inductor of the boost converter when current is reversed through the inductor based, at least in part, on the first current; and/or control recovery of the boost converter during the second time period based, at least in part, on the second current to recover the boost converter from the reverse current operation.

In some embodiments, the current monitoring circuit may be coupled to the second switch and configured to mirror a current through the second switch; the second current may be determined by estimating an inductance value of the inductor based, at least in part, on the measured first current and calculating the second current based, at least in part, on the estimated inductance value; and/or the boost converter may be configured to control the recovery by controlling a duration of a first time period for building current in the inductor, and controlling a duration of a second time period for discharging the inductor into the capacitor of the boost converter.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 2:
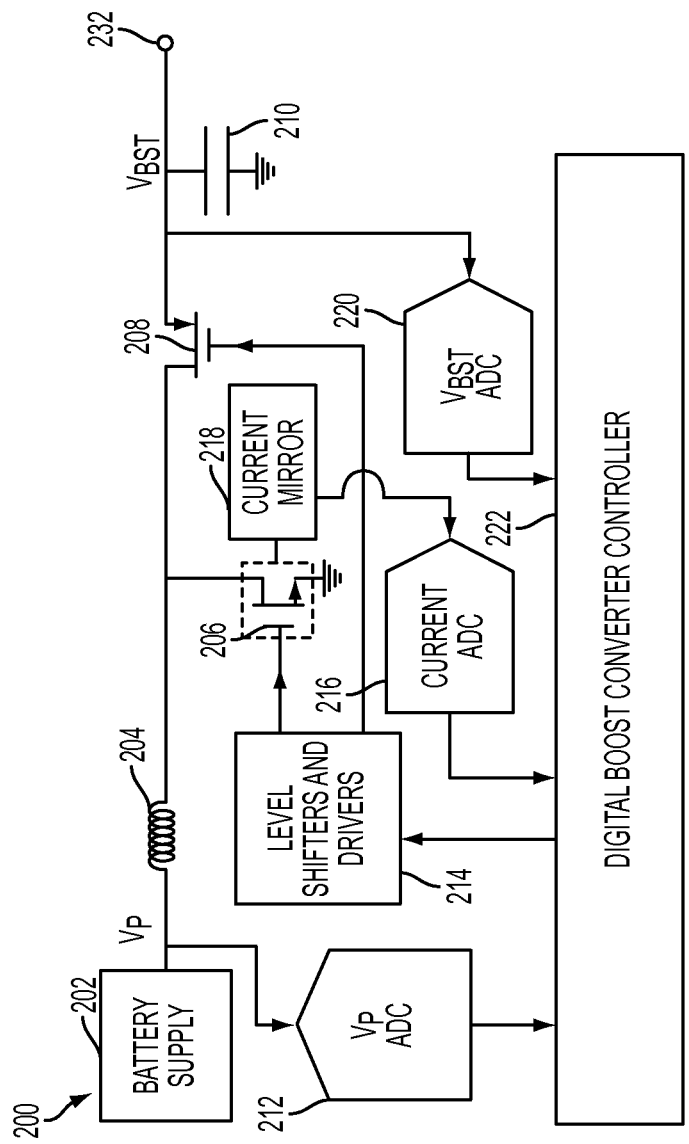
FIG. 2 is a block diagram of an audio amplifier with a dynamically-controlled boost converter according to one embodiment of the disclosure.

FIG. 2 is a block diagram of an audio amplifier with a dynamically-controlled boost converter according to one embodiment of the disclosure. A circuit 200 may include a battery supply 202, which provides a voltage, $V_p$, to the circuit 200. The circuit 200 may also include an inductor 204, with an inductance value, $L_{boost}$, coupled to an n-channel field effect transistor (NFET) 206, a p-channel field effect transistor (PMOS) 208, and a capacitor 210, having a capacitance value $C_{boost}$.

The configuration of the components 204, 206, 208, and 210 allow a digital boost converter controller 222 to generate a boost voltage, $V_{bst}$, higher than the supply voltage, $V_p$. For example, during a first time period the NFET 206 may be switched on to a conducting state to couple the inductor 204 with ground, while the PFET 208 is switched off to a non-conducting state. This causes the supply voltage, $V_p$, to be placed across the inductor 204, current to flow through the inductor 204, and energy to be stored in the inductor 204. Then, during a second time period the NFET 206 may be switched off to a non-conducting state while the PFET 208 is switched on to a conducting state. This causes the inductor 204 to couple to ground through the capacitor 210. Thus, energy stored in the inductor 204 is transferred to the capacitor 210. As energy is stored in the capacitor 210, the voltage across the capacitor 210 increases and allows the boost voltage, $V_{bst}$, at output node 232 to increase beyond the supply voltage, $V_p$. An audio amplifier (not shown) may be coupled to the output node 232 to receive the boosted voltage, $V_{bst}$. The controller 222 may control operation of the NFET 206 and the PFET 208 to control a duration of the first time period and the second time period, which regulates the transfer of power from the inductor 204 to the capacitor 210 and thus regulates the level of the boost voltage, $V_{bst}$.

The controller 222 may receive one or more inputs that provide information to allow the controller 222 to control operation of the circuit 200. For example, the controller 222 may be coupled to an analog-to-digital converter (ADC) 212 that provides the controller 222 with information about the voltage level of the supply voltage, $V_p$. In another example, the controller 222 may be coupled to an analog-to-digital converter (ADC) 216 that provides the controller 222 with information about a current level through the inductor 204. The ADC 216 may determine the current through the inductor 204 through a current mirror 218 coupled to the NFET 206. In yet another example, an analog-to-digital converter (ADC) 220 may be coupled to the controller 222 to provide information about the boost voltage, $V_{bst}$, level.

Figure 1:
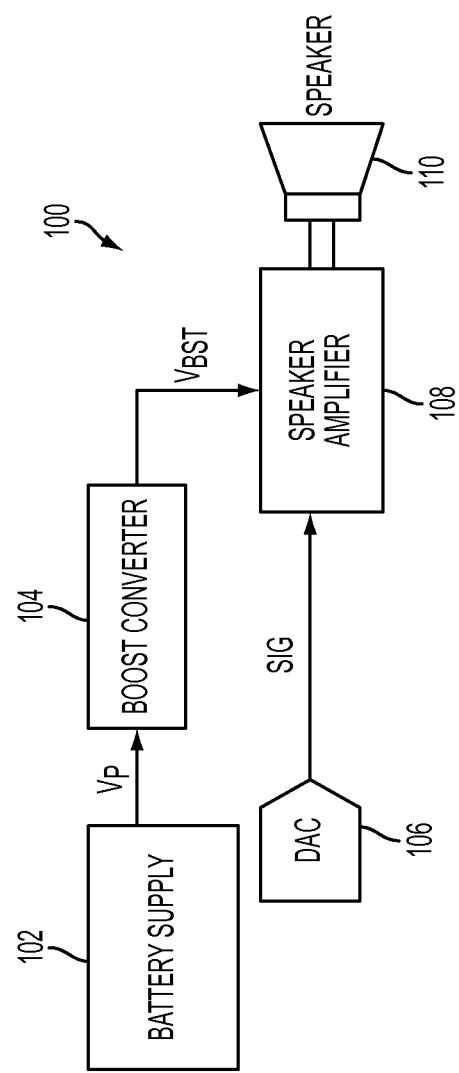
FIG. 1 is a conventional audio amplifier with a boost converter.

The circuit 200 may allow the controller 222 to control the boost converter through various inputs to the controller 222 and logic implemented in the controller 222. In comparison, the conventional audio amplifier with boost converter of FIG. 1 described above provides only a static boost voltage to the speaker amplifier, which leads to low efficiency and poor response to changing conditions. In one embodiment, the controller 222 may estimate an inductance value, $L_{boost}$, for the inductor 204 to monitor operating conditions of the inductor 204 and control the boost converter in the event of changes to the inductor 204.

The inductance value, $L_{boost}$, of inductor 204 may vary with the value of current, $I_{boost}$, passing through the inductor 204. Additionally, energy-storage characteristics of the inductor 204 change when the inductor 204 approaches or operates near or in saturation. In one embodiment, the controller 222 may measure inductor current through the current mirror 218 and the current analog-to-digital converter (ADC) 216. The current mirror 218 mirrors a current through the NFET 206, which is the current through the inductor 204. The ADC 216 then converts the analog value of current through the inductor 204 to a digital value for processing by the controller 222. The controller 222 may then determine a duration of a first time period for building current in the inductor 204 and duration of a second time period for discharging current to the capacitor 210 based on the known current in the inductor 204.

Figure 3:
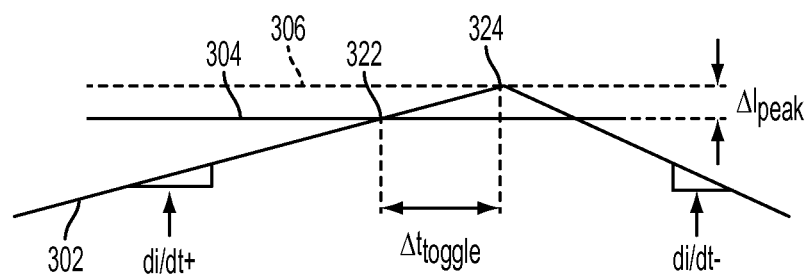
FIG. 3 is a graph illustrating estimation of an inductor value in a boost converter according to one embodiment of the disclosure.

FIG. 3 is a graph illustrating estimation of an inductance value in a boost converter according to one embodiment of the disclosure. The controller 222 may determine the transition time from the first time period to the second time period when the NFET 206 turns off and the PFET 208 turns on based on when the measured current, $I_{boost}$, shown as line 302 crosses either a slope-compensated signal or a fixed upper limit shown as line 304. After the controller 222 decides to toggle the NFET 206 and the PFET 208, control signals from the controller 222 propagate through the level shifters and drivers 214 before driving the gates of the NFET 206 and PFET 208. During this propagation delay, $\Delta t_{toggle}$, the inductor current, $I_{boost}$, continues to rise, which causes an error in the peak-current, $\Delta I_{peak}$, detected by the current mirror 218. This error value may be computed as a difference between the inductor current, shown in line 302, at the time of the control signal generation, indicated as cross point 322 and the actual value of the inductor current when the NFET 206 and the PFET 208 actually switch at point 324.

The up-slope of the inductor current of line 302 may be defined by $$\frac{di^+}{dt} = K_{CM} * \frac{V_p}{L_{boost}},$$

and a down-slope of the inductor current of line 302 may be defined by $$\frac{di^-}{dt} = K_{CM} * \frac{V_{bst} - V_p}{L_{boost}},$$

where $L_{boost}$ is the inductance value, and $K_{CM}$ is the gain value of the current measurement path including the current mirror 218. The lines 302 and 304 cross at point 322 at time $t_1$ at a current value $P_1$. After the propagation delay ($\Delta t_{toggle}$), the inductor current stops rising at time $t_2$ at a current value $P_2$. The error in the actual peak value of the inductor current is $\Delta I_{peak}$. When calculated from the up-slope of line 302, $\Delta I_{peak}$ may be calculated as $$\Delta I_{peak} = \left(K_{CM} * \frac{V_p}{L_{BOOST}}\right) * \Delta t_{toggle}.$$

Because $\Delta t_{toggle}$ is relatively constant, $V_P$ is measured and provided to the controller 222 through the analog-to-digital converter (ADC) 212, and $K_{CM}$ is known, $\Delta I_{peak}$ is directly affected by the value of $L_{boost}$. The error injected by $\Delta I_{peak}$ may be calculated and calibrated out if the value of $L_{boost}$ is known. In one embodiment, an amount of slope-compensation of line 304 for stability may be calculated as approximately at least half the down-slope of the line 302, given by $$\text{Slope Compensation} = 0.5 * \frac{di}{dt} = 0.5 * K_{CM} * \frac{V_{BST} - V_P}{L_{BOOST}},$$

where $V_P$ and $V_{bst}$ are measured and provided to the controller 222, and $K_{CM}$ is known. If $L_{boost}$ varies, a variation in the slope compensation may occur, which could lead to insufficient slope compensation and instability due to, for example, sub-harmonic oscillation. However, the $L_{boost}$ value may be determined by the controller 222 and used to improve the slope-compensation. Without an $L_{boost}$ value, a worst-case slope compensation value may be used that is not optimal for many operating conditions. Additionally, if the controller 222 recognizes that the value of $L_{boost}$ is decreasing, the controller 222 may adjust slope-compensation to counter the effect of an increased slope-compensation requirement.

Changes in $L_{boost}$ with changing inductor current may thus be compensated for by calculating the $L_{boost}$ value, knowing a starting value of $L_{boost}$, calibrating its effect out initially, and then comparing a slope of the line 302 with a calculated value of the slope. Thus, changes in $L_{boost}$, such as due to variations in current and operation at or near saturation, may be compensated.

In one embodiment, an inductance $L_{boost}$ estimator may be integrated with the controller 222, to improve slope-compensation calculation, which may improve system stability, and to accurately determine peak current, which may improve absolute current accuracy and may prevent the inductor 204 from operating in saturation.

An initial calibration may be performed to determine when calculated inductance values, $L_{boost}$, change. First, a known value of current may be forced through the inductor 204 and through the NFET 206, and thus through the current mirror 218. This known value of current may be used by the controller 222 to calibrate the current ADC 216 and the current mirror 218. Then, the boost converter may be operated with no load while samples of the current ADC 216 are taken by the controller 222 to establish a baseline inductance value from $$L_{BOOST} = VP \Big/ \left(\frac{di}{dt}\right),$$

where di is the difference between the current ADC 216 samples, and dt is the sampling period of the ADC 216. An initial $\Delta I_{peak}$ and slope compensation value may be calculated from these initial measurements and stored by the controller 222. During normal operation, this baseline $L_{boost}$ value may be repeatedly compared with newly-calculated values of $L_{boost}$. A change between the current value of $L_{boost}$ and the initial value of $L_{boost}$ may cause the controller 222 to update $\Delta I_{peak}$ and the slope compensation values as described in the calculations above.

During saturation, the earlier $\Delta I_{peak}$ equation may not be valid because the inductor waveform may depart from its expected saw-tooth signature for a peaking waveform that is non-linear at the tips. According to some embodiments, the controller 222 may detect when saturation occurs and prevent saturation by reducing the current load, and consequently the current draw, thereby bringing the inductor 204 out of saturation and back into linear operation.

Figure 4:
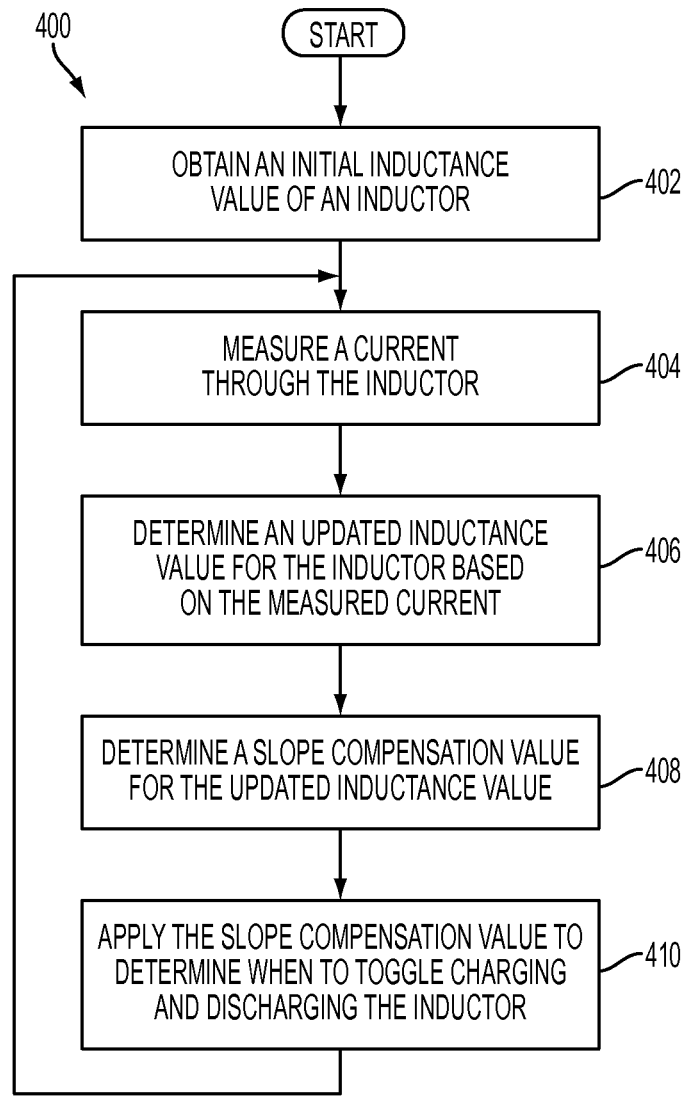
FIG. 4 is a flow chart illustrating a method of estimating an inductance value and modifying boost converter operation in response to changes in inductance value according to one embodiment of the disclosure.

FIG. 4 is a flow chart illustrating a method of estimating an inductance value and modifying boost converter operation in response to changes in inductance value according to one embodiment of the disclosure. A method 400 may begin at block 402 with obtaining an initial inductance value of an inductor of a boost converter. Block 402 may be performed, for example, during a start-up procedure before audio is output from an audio amplifier. At block 404, a current through the inductor is measured by the controller during operation of the boost converter, such as while the boost converter and audio amplifier are amplifying an audio signal.

At block 406, an updated inductance value for the inductor of the boost converter may be determined by the controller based on the measured current of block 404. The updated inductance value may indicate changes in the inductance value that are caused by, for example, operation at or near saturation or other conditions. At block 408, when the updated inductance value of block 404 differs from the initial inductance value of block 402, an updated slope compensation value may be calculated for the updated inductance value of block 406. The updated slope compensation value may be calculated from $$\text{Slope Compensation} = 0.5 * \frac{di}{dt} = 0.5 * K_{CM} * \frac{V_{BST} - V_P}{L_{BOOST}},$$

wherein $K_{CM}$ is a gain value, $V_{bst}$ is the boost voltage, $V_P$ is a supply voltage, and $L_{boost}$ is the inductance value of the inductor.

The updated slope compensation value of block 408 may be applied, at block 410, to determine when to toggle charging and discharging of the inductor. For example, the controller may calculate an approximate time the current through the inductor will reach a peak current level by calculating a toggle delay in toggling the NFET and PFET of the boost converter. The controller may then toggle the NFET and PFET in advance of the time the inductor would reaches the peak current level, taking into account the toggle delay, to reduce damage to the inductor and undesirable effects output by the audio amplifier when saturation is reached. The method 400 executing in the controller may return to block 404 to repeatedly, continuously, periodically, or occasionally measure a current through the inductor and update the calculated inductance value at block 406 and slope compensation value at block 408.

As described above, an initial calibration and storage of the inductance, $L_{boost}$, in conjunction with periodic or occasional re-evaluation of the inductance value, $L_{boost}$, by using, for example, the measured supply voltage, $V_P$, by the ADC 212 and the measured boost current by the ADC 216 allows the controller 222 to monitor changes in the inductance value, $L_{boost}$. A sudden drop in this value, such as approximately a 30 to 80% change, may be indicative of reaching saturation or sudden inductor current spiking, which may cause damage to the inductor 204 and/or the boost converter. This information may be used by the controller 222 to control the audio amplifier and/or the boost converter to reduce the load and prevent damage to both the inductor and the boost converter. Additionally, the controller 222 may dynamically adjust slope compensation to better stabilize the system, as well as increasing the accuracy of detected peak inductor current levels. For example, slope compensation may be adjusted between approximately −70 and +80 percent during a span of approximately 3-10 microseconds.

Figure 5:
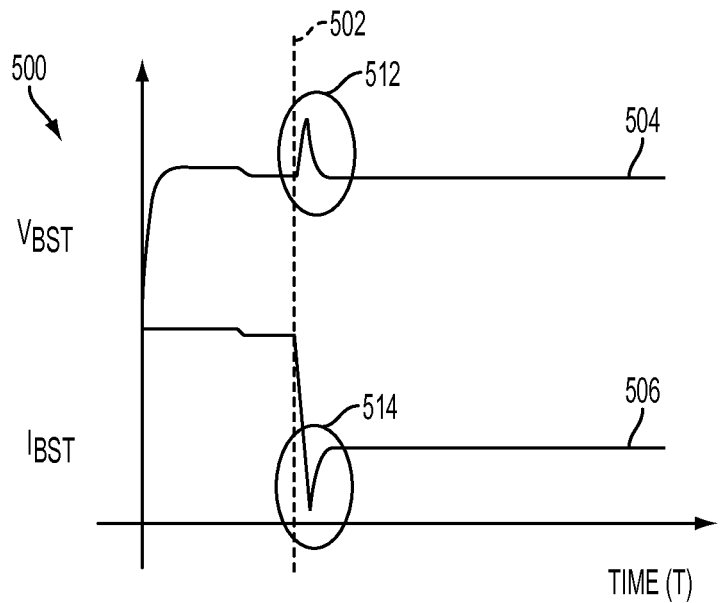
FIG. 5 is a graph illustrating reverse current through an inductor according to one embodiment of the disclosure.

An inductance value, $L_{boost}$, determined for an inductor of a boost converter may also be used to improve operation of the boost converter during periods of reverse current, such as when a drop in load occurs in the boost converter. FIG. 5 is a graph illustrating reverse current through an inductor according to one embodiment of the disclosure. A graph 500 includes a line 504 illustrating a boost voltage, $V_{bst}$, and a line 506 illustrating a boost current, $I_{bst}$. A load drop may occur at time 502 causing a spike 512 in the boost voltage, $V_{bst}$, and a large reverse inductor current 514 in the boost current, $I_{bst}$. The reverse inductor current 514 may cause erroneous readings in the current ADC 216 and the current mirror 218 of FIG. 2. Then, the controller 222, without current information from the current ADC 216, may not have feedback to control the charge and discharge cycle of the boost converter. Without appropriate feedback, a slow recovery of the boost converter and undesirable back-power current return to the battery supply 202 may occur.

Figure 6:
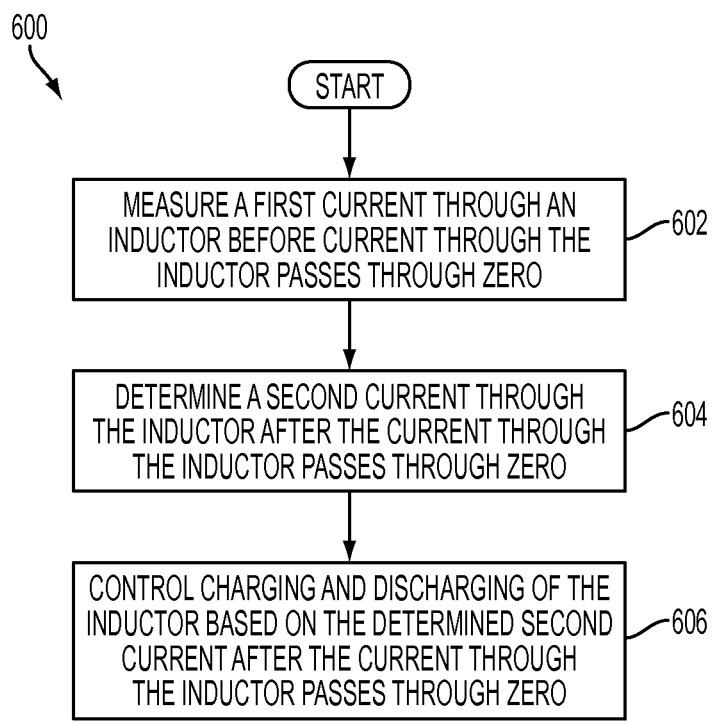
FIG. 6 is a flow chart illustrating operation of a boost converter during reverse current periods according to one embodiment of the disclosure.

In one embodiment, loss of control of the boost convert may be improved by having an inductance value, $L_{boost}$, even when the current has reversed through the inductor 204. For example, the controller 222 may execute an algorithm illustrated in FIG. 6. FIG. 6 is a flow chart illustrating operation of a boost converter during reverse current periods according to one embodiment of the disclosure. A method 600 begins at block 602 with measuring a first current through an inductor of a boost converter during a first time period of a switch cycle, before current through the inductor crosses through zero current. The measured current may be used to calculate an inductance value, $L_{boost}$, as described above with reference to FIG. 4.

When an event causes current to reverse through the inductor, or the current to cross through zero current, the latest calculated inductance value may be used to determine a current through the inductor. At block 604, a second current through the inductor is determined based, at least in part, on the first current during a second time period of the switch cycle after the first time period. The current may be calculated from the equation:

$$\frac{di}{dt} = \frac{K_{CM}(V_{BOOST} - V_P)}{L_{BOOST}}.$$

At block 606, the discharging and charging of the inductor of the boost converter during the second time period may be controlled based, at least in part, on the determined second current, which may be calculated from the inductance value, $L_{boost}$. For example, a current waveform may be estimated to recover the boost converter from the reverse current operation and the discharging and charging of the inductor controlled to obtain the estimated current waveform. After the boost converter has recovered, current measurements may resume through the use of the current ADC 216 and the current mirror 218 and the controller 222 may return to normal control of the boost converter.

Additionally, operating conditions of the boost converter and audio amplifier may be temporarily changed to reduce undesirable effects caused by the reverse current through the inductor and/or to improve recovery from the revise current condition. For example, a bandwidth of the boost converter may be reduced after detecting a load drop or other event that may cause a reverse current condition. The reduced bandwidth allows a quicker detection and quicker correction of the spike in the boost voltage, $V_{bst}$, leading to a lower boost voltage overshoot and lower total charge to be discharged to return to normal operation.

Figure 7:
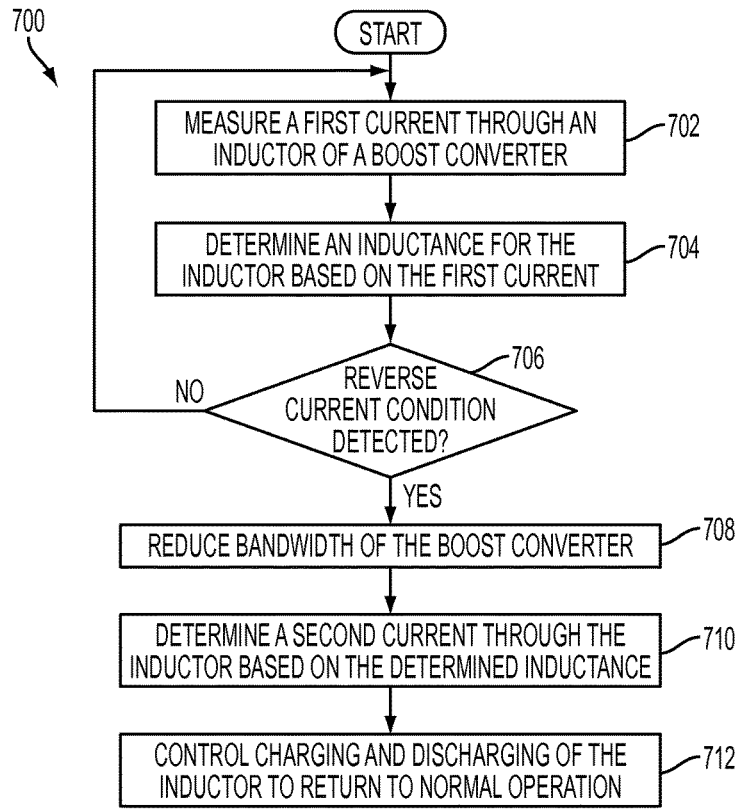
FIG. 7 is a flow chart illustrating operation of a boost converter with reduced bandwidth during reverse current periods according to one embodiment of the disclosure.

FIG. 7 is a flow chart illustrating operation of a boost converter with reduced bandwidth during reverse current periods according to one embodiment of the disclosure. A method 700 begins at block 702 with measuring a first current through an inductor of a boost converter. At block 704, an inductance for the inductor is determined based on the measured first current of block 702. If no reverse current condition is detection, such as a load drop, then the method 700 returns to block 702 from block 706 to update the inductance value for the inductor. If a reverse current condition is detected at block 706, the method 700 proceeds to block 708 to reduce a bandwidth of the boost converter. At block 710, a second current through the inductor is determined based on the determined inductance of block 704, which is based on the measured first current of block 702. The determination of block 710 may be carried out similar to the determination described with respect to block 604 with reference to FIG. 6. Then, at block 712, the charging and discharging of the inductor may be controlled to return the boost converter to normal operation.

Figure 8:
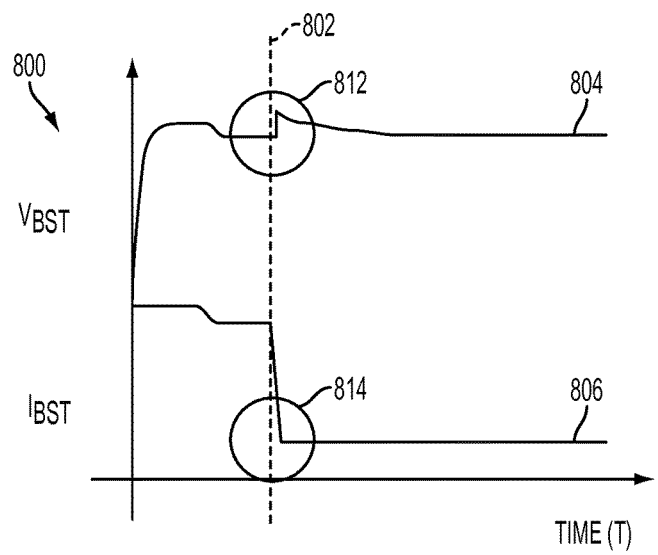
FIG. 8 is a graph illustrating a boost voltage and an inductor current for a boost converter operated with reduced bandwidth during reverse current periods according to one embodiment of the disclosure.

The reduced bandwidth of the boost converter and calculation of current during reverse current conditions reduces a spike in the boost voltage, $V_{bst}$, and reduces the magnitude of reverse current. FIG. 8 is a graph illustrating a boost voltage and an inductor current for a boost converter operated with reduced bandwidth during reverse current periods according to one embodiment of the disclosure. A graph 800 includes a line 804 for a boost voltage, $V_{bst}$, and a line 806 for a boost current, $I_{bst}$. At a time 802, an event, such as a load drop, may occur causing a reverse current condition in the inductor of the boost converter. A controller operating according to the method of FIG. 7 may reduce bandwidth in the boost converter and calculate current estimates for the inductor current to control the boost converter. As a result of this control, a reduced reverse inductor current 814 is experienced by the inductor and a reduced boost voltage spike 812 occurs in the boost converter.

Other operating conditions of the boost converter and audio amplifier may be temporarily changed to reduce undesirable effects caused by the reverse current through the inductor and/or to improve recovery from the reverse current condition. For example, a resistance in the boost converter may be increased to reduce large reverse currents from developing in the boost converter. In one embodiment, resistance may be increased by increasing a resistance of the p-channel field effect transistor (PFET) 208 of the boost converter shown in FIG. 2.

Figure 9:
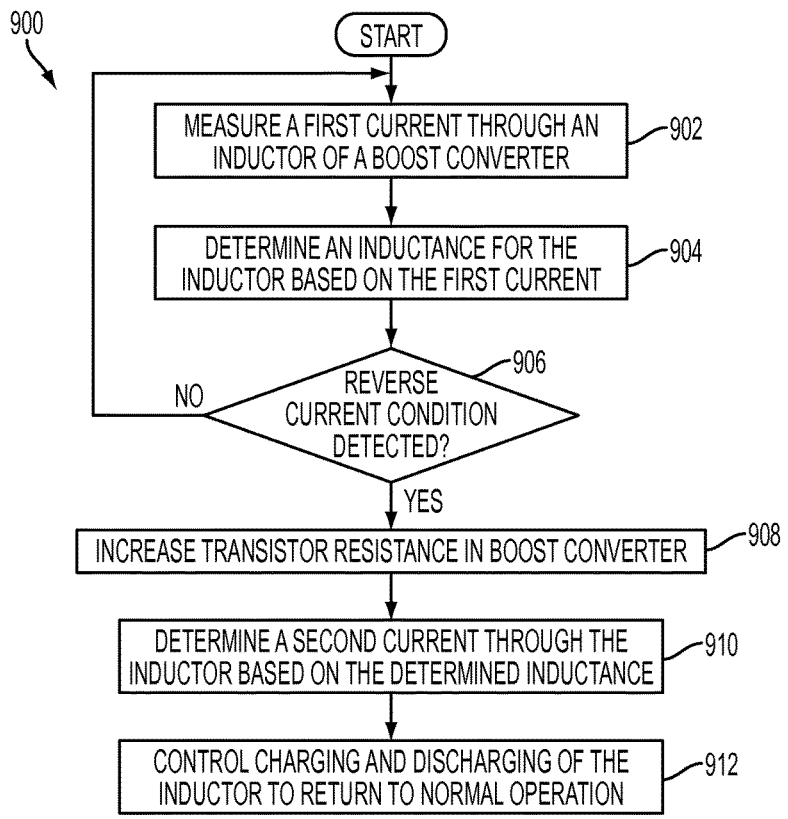
FIG. 9 is a flow chart illustrating operation of a boost converter with increased resistance during reverse current periods according to one embodiment of the disclosure.

FIG. 9 is a flow chart illustrating operation of a boost converter with increased resistance during reverse current periods according to one embodiment of the disclosure. A method 900 begins at block 902 with measuring a first current through an inductor of a boost converter. At block 904, an inductance for the inductor is determined based on the measured first current of block 902. If no reverse current condition is detection, such as a load drop, then the method 900 returns to block 902 from block 906 to update the inductance value for the inductor. If a reverse current condition is detected at block 906, the method 900 proceeds to block 908 to increase a resistance of at least one component the boost converter. At block 910, a second current through the inductor is determined based on the determined inductance of block 904, which is based on the measured first current of block 902. The determination of block 910 may be carried out similar to the determination described with respect to block 604 with reference to FIG. 6. Then, at block 912, the charging and discharging of the inductor may be controlled to return the boost converter to normal operation.

Figure 10:
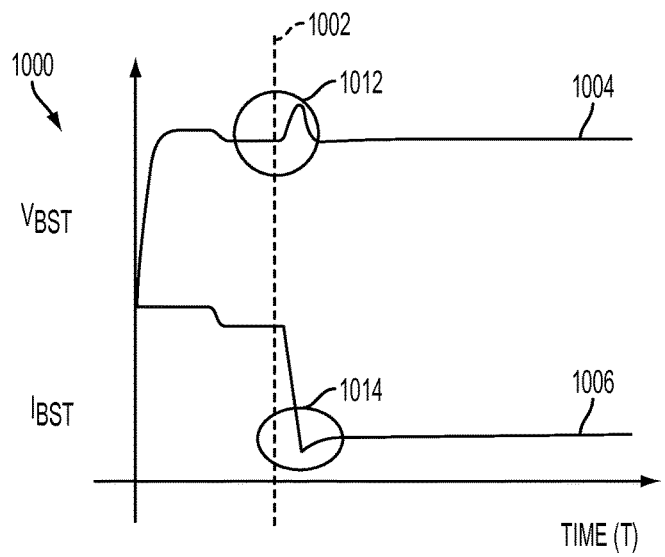
FIG. 10 is a graph illustrating a boost voltage and an inductor current for a boost converter operated with increased resistance during reverse current periods according to one embodiment of the disclosure.

The increased resistance of the boost converter and calculation of current during reverse current conditions reduces a spike in the boost voltage, $V_{bst}$, and reduces the magnitude of reverse current. FIG. 10 is a graph illustrating a boost voltage and an inductor current for a boost converter operated with increased resistance during reverse current periods according to one embodiment of the disclosure. A graph 1000 includes a line 1004 for a boost voltage, $V_{bst}$, and a line 1006 for a boost current, $I_{bst}$. At a time 1002, an event, such as a load drop, may occur causing a reverse current condition in the inductor of the boost converter. A controller operating according to the method of FIG. 9 may increase resistance of the boost converter and calculate current estimates for the inductor current to control the boost converter. As a result of this control, a reduced reverse inductor current 1014 is experienced by the inductor and a reduced boost voltage spike 1012 occurs in the boost converter.

Additional techniques may be used by the digital boost converter controller 222 to monitor for and handle reverse current conditions in the boost converter, such as when a load drop occurs. In one embodiment, audio input may be buffered and the information in the buffered audio used to control the boost converter for a load change. For example, a detected load drop may be used to preemptively temporarily reduce the boost voltage, $V_{bst}$, to reduce the peak of a spike in the boost voltage that occurs during a load drop. The boost voltage, $V_{bst}$, may then be returned to normal values after the reverse current condition has passed. In another embodiment, a load drop may be detected using a comparator coupled to the transistor 208 of the boost converter of FIG. 2. The comparator may provide information to the controller 222 to determine when a reverse current condition occurs.

If implemented in firmware and/or software, the operations described above, such as with reference to FIGS. 4, 6, 7, and 9 may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method for reducing a spike in boost voltage output from a boost converter, comprising:
   measuring a first current value for an inductor current through an inductor of the boost converter during a first time period of a switch cycle, before the inductor current through the inductor crosses through a zero current while the boost converter is outputting a first boost voltage;
   determining a second reverse current value for the inductor current through the inductor based, at least in part, on the first current value during a second time period of the switch cycle after the first time period and after the inductor current crosses through the zero current to begin a reverse current operation, wherein the step of determining the second reverse current value comprises:
     estimating an inductance value of the inductor based, at least in part, on the measured first current value; and
     determining the second reverse current value based, at least in part, on the estimated inductance value;
   detecting a load drop on a load of the boost converter;
   reducing the boost voltage output of the boost converter to a second boost voltage lower than the first boost voltage after detecting the load drop;
   controlling discharging and charging of the inductor of the boost converter during the second time period based, at least in part, on the determined second reverse current value to recover the boost converter from the reverse current operation; and
   returning the boost voltage output of the boost converter to the first boost voltage after recovering the boost converter from the reverse current operation.

2. The method of claim 1, wherein the step of measuring the first current value comprises mirroring the first current value through the inductor in a field effect transistor (FET).

3. The method of claim 1, wherein the step of calculating comprises calculating the second reverse current value based, at least in part, on the estimated inductance value, a boost voltage value, and a supply voltage value.

4. The method of claim 1, further comprising decreasing a bandwidth of the boost converter to limit the second reverse current value after detecting the load drop.

5. The method of claim 1, further comprising increasing a resistance of a transistor coupled to the inductor to limit the second reverse current value after detecting the load drop.

6. The method of claim 1, wherein the step of controlling the discharging and charging comprises:
   controlling a duration of a first time period for building the inductor current; and
   controlling a duration of a second time period for discharging the inductor into a capacitor of the boost converter.

7. An apparatus, comprising:
   a boost converter comprising:
     a boost voltage output node configured to output a boost voltage to an audio amplifier driving a load;
     an inductor coupled to the boost voltage output node; and
     a current measurement circuit coupled to the inductor; and
   a controller coupled to the boost converter and configured to:
     measure a first current value for an inductor current through the inductor of the boost converter during a first time period of a switch cycle, before the inductor current through the inductor crosses through a zero current while the boost converter is outputting a first boost voltage;
     determine a second reverse current value for the inductor current through the inductor based, at least in part, on the first current value during a second time period of the switch cycle after the first time period and after the inductor current crosses through the zero current to begin a reverse current operation, wherein the second reverse current value is determined by performing steps comprising:
       estimating an inductance value of the inductor based, at least in part, on the measured first current value;

determining the second reverse current value based, at least in part, on the estimated inductance value;

detecting a load drop on a load of the boost converter; and reducing the boost voltage to a second boost voltage lower than the first boost voltage after detecting the load drop; and control charging and discharging of the inductor of the boost converter during the second time period based, at least in part, on the second reverse current value to recover the boost converter from the reverse current operation; and returning the boost voltage to the first boost voltage after recovering the boost converter from the reverse current operation.

8. The apparatus of claim 7, wherein the boost converter comprises a first n-channel field emission transistor (NFET) coupled to the inductor and configured to couple the inductor to a ground, wherein the current monitoring circuit comprises a second n-channel field emission transistor (NFET) coupled to the first NFET of the boost converter and configured to mirror a current in the first NFET, wherein the boost converter further comprises an analog-to-digital converter (ADC) coupled to the current monitoring circuit, and wherein the controller is configured to measure the first current value by reading the analog-to-digital converter (ADC).

9. The apparatus of claim 8, wherein the controller is further configured to calculate the second reverse current value based, at least in part, on the estimated inductance value, the boost voltage, and a supply voltage.

10. The apparatus of claim 7, wherein the controller is further configured to decrease a bandwidth of the boost converter after detecting the drop in the load.

11. The apparatus of claim 7, wherein the controller is further configured to increase a resistance of a transistor coupled to the inductor after detecting the drop in the load.

12. The apparatus of claim 7, wherein the boost converter further comprises a capacitor coupled to the boost voltage output node and wherein the controller is configured to:

control a duration of a first time period for building the inductor current; and control a duration of a second time period for discharging the inductor into the capacitor of the boost converter.

13. The apparatus of claim 7, wherein the controller and the boost converter are integrated in an integrated circuit.

14. An integrated circuit, comprising:

an audio output node configured to drive a load with an amplified audio signal;

an audio amplifier configured to amplify an audio signal to generate the amplified audio signal at the audio output node;

a boost converter coupled to the audio amplifier, wherein the boost converter comprises:

an inductor;

a first switch coupled to the inductor and configured to couple the inductor to the audio output node;

a second switch coupled to the inductor and configured to couple the inductor to a ground;

a current monitoring circuit configured to measure a current through the inductor; and an analog-to-digital converter (ADC) coupled to the current monitoring circuit; and a boost converter controller coupled to the boost converter and configured to:

measure a first current value for an inductor current through the inductor of the boost converter during a first time period of a switch cycle, before the inductor current through the inductor crosses through zero current while the boost converter is outputting a first boost voltage;

determine a second reverse current value for the inductor current through the inductor based, at least in part, on the first current value during a second time period of the switch cycle after the first time period and after the inductor current crosses through the zero current to begin a reverse current operation, wherein the second reverse current value is determined by performing steps comprising:

estimating an inductance value of the inductor based, at least in part, on the measured first current value; and determining the second reverse current value based, at least in part, on the estimated inductance value; and detect a load drop on a load of the boost converter;

reduce the boost voltage output to the audio amplifier to a second boost voltage lower than the first boost voltage after detecting the load drop;

control discharging and charging of the inductor of the boost converter during the second time period based, at least in part, on the determined second reverse current value to recover the boost converter from the reverse current operation; and return the boost voltage output to the audio amplifier to the first boost voltage after recovering the boost converter from the reverse current operation.

15. The integrated circuit of claim 14, wherein the current monitoring circuit is coupled to the second switch and configured to mirror a current through the second switch.

16. The integrated circuit of claim 14, wherein the boost converter controller is configured to control the discharging and charging by:

controlling a duration of a first time period for building the inductor current; and controlling a duration of a second time period for discharging the inductor into a capacitor of the boost converter.

* * * * *